United States Patent
Lifka et al.

(10) Patent No.: US 7,692,376 B2
(45) Date of Patent: Apr. 6, 2010

(54) ELECTRICAL DEVICE WITH CROSSOVER OF ELECTRODE CONNECTING LINES

(75) Inventors: Herbert Lifka, Eindhoven (NL); Erik Albertus Hendrikus Monica Stroex, Heerlen (NL); Mark Bakker, Heerlen (NL); Sietze Jongman, Heerlen (NL); Markus Heinrich Klein, Heerlen (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 1329 days.

(21) Appl. No.: 10/528,486

(22) PCT Filed: Aug. 8, 2003

(86) PCT No.: PCT/IB03/03629

§ 371 (c)(1),
(2), (4) Date: Mar. 18, 2005

(87) PCT Pub. No.: WO2004/027868

PCT Pub. Date: Apr. 1, 2004

(65) Prior Publication Data

US 2006/0028126 A1    Feb. 9, 2006

(30) Foreign Application Priority Data

Sep. 20, 2002    (EP) .................................. 02078908

(51) Int. Cl.
*H01J 9/00*    (2006.01)
(52) U.S. Cl. ...................... 313/505; 313/500; 313/506; 445/24; 361/780; 361/792; 361/794; 174/255
(58) Field of Classification Search ...................... 313/51
See application file for complete search history.

(56) References Cited

U.S. PATENT DOCUMENTS

| | | | |
|---|---|---|---|
| 4,999,539 A * | 3/1991 | Coovert et al. ............... | 313/505 |
| 5,294,869 A | 3/1994 | Tang et al. | |
| 5,670,994 A * | 9/1997 | Kawaguchi et al. ......... | 345/206 |
| 5,701,055 A | 12/1997 | Nagayama et al. | |
| 5,936,344 A | 8/1999 | Nagayama | |
| 5,962,970 A | 10/1999 | Yokoi et al. | |
| 6,140,765 A * | 10/2000 | Kim et al. .................... | 313/506 |
| 6,414,249 B1 | 7/2002 | Vickers | |
| 6,507,384 B1 * | 1/2003 | Endo et al. ................... | 349/149 |
| 6,600,225 B2 * | 7/2003 | Tanaka ........................ | 257/750 |
| 6,656,611 B2 * | 12/2003 | Tai et al. ...................... | 428/690 |
| 6,787,992 B2 * | 9/2004 | Chuman et al. .............. | 313/505 |
| 6,798,145 B2 * | 9/2004 | Ishizuka ................... | 315/169.1 |
| 6,940,214 B1 * | 9/2005 | Komiya et al. ................ | 313/51 |
| 6,979,643 B2 * | 12/2005 | Gustafsson et al. .......... | 438/666 |
| 7,180,239 B2 * | 2/2007 | Liedenbaum et al. ....... | 313/507 |
| 7,235,921 B2 * | 6/2007 | Hieda et al. .................. | 313/504 |
| 7,417,371 B2 * | 8/2008 | Birnstock et al. ............ | 313/506 |
| 2003/0071563 A1 * | 4/2003 | Hamada et al. .............. | 313/500 |

FOREIGN PATENT DOCUMENTS

| | | | |
|---|---|---|---|
| JP | 2000200053 A | | 11/2000 |
| JP | 2002353631 A | * | 12/2002 |

* cited by examiner

*Primary Examiner*—Sikha Roy

(57) ABSTRACT

The invention relates to an electrical device comprising a substrate carrying at least one component comprising at least one electrode, a first connecting line electrically connected to said electrode, wherein the first connecting line bridges a second connecting line by means of a crossover. The crossover is, at least at one side, bounded by an electrically insulating structure. The invention allows new testing methods and efficient lead-outs for an electrical device, such as electroluminescent display devices.

9 Claims, 8 Drawing Sheets

ELECTRICAL DEVICE WITH CROSSOVER OF ELECTRODE CONNECTING LINES

Figure 1A:
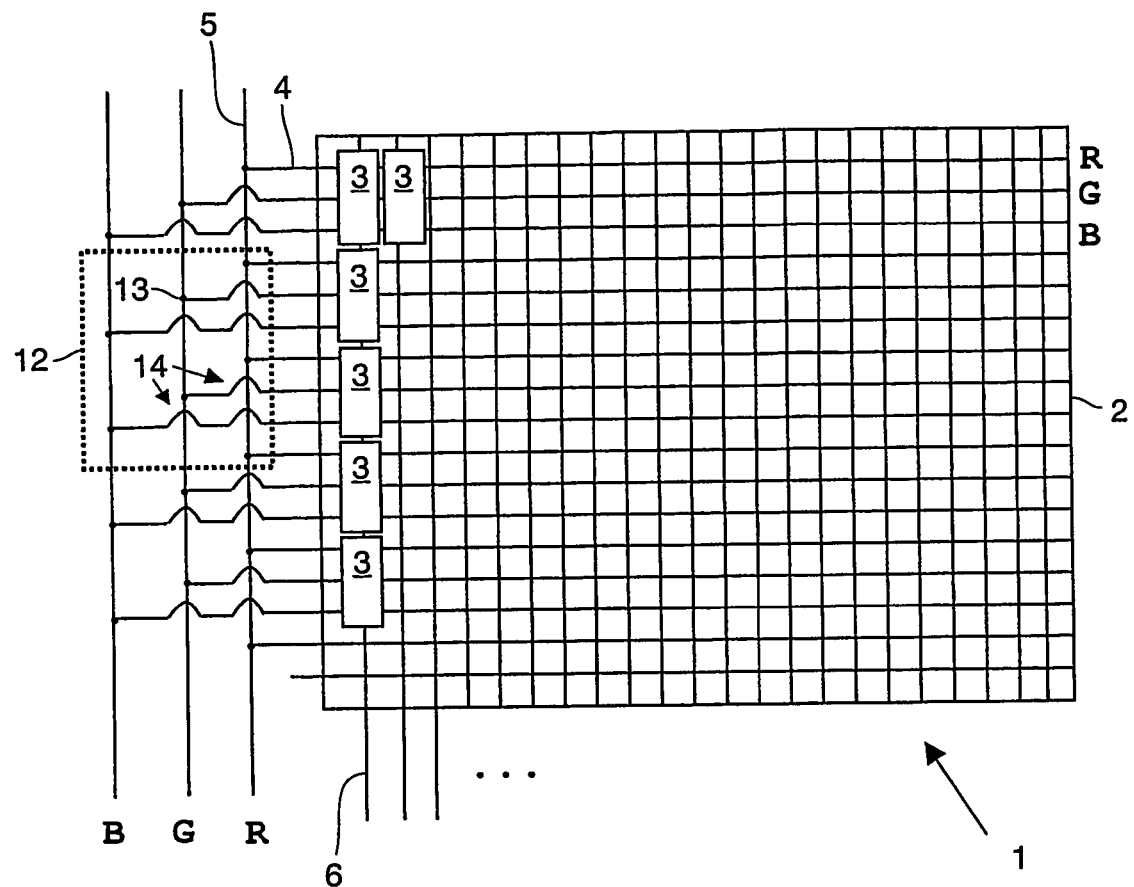

The invention relates to an electrical device comprising a substrate carrying at least one component comprising at least one electrode, a first connecting line for electrically connecting to said electrode, wherein said first connecting line bridges a second connecting line by means of a crossover.

U.S. Pat. No. 5,936,344 discloses an electroluminescent element comprising a substrate carrying organic light-emitting devices, each having a plurality of organic material layers made of organic compounds sandwiched between an anode layer and a cathode layer. The substrate further carries a conductive connecting line for electrically connecting an anode or a cathode to a bonding pad at the periphery of the display panel. The connecting line is made of the same material as the cathode in a standard cathode-making process and has a thickness substantially the same as that of the cathode. The electroluminescent element has connecting lines at the level of the anode layer and the level of the cathode layer. A connecting line at the level of the anode layer may be connected with a connecting line at the level of the cathode layer through openings. By using such structures, crossovers of connecting lines can be obtained. A crossover of a connecting line is an electrically insulating structure for bridging one connecting line with another connecting line without making electrical contact between these two connecting lines. Such crossovers can be used for connecting the anode and the cathode of each electroluminescent element to the appropriate bonding pad, or for re-routing the connecting lines of an electrical device or an integrated circuit, such as a chip on glass.

A disadvantage of the prior art is that the process of manufacturing electroluminescent elements or integrated circuits is not suitable to meet the trend towards high resolution, which results in a substantial scale down of the electrode pitch. A considerable number of the high-resolution electroluminescent elements produced had a short-circuit between two adjacent connecting lines when the standard cathode-making process was used for simultaneously forming cathodes, connecting lines and crossovers.

The invention aims, inter alia, to provide an electrical device which has a reduced risk of a short-circuit between adjacent connecting lines and/or crossovers. Such an electrical device may be an electroluminescent display device or an integrated circuit wherein adjacent connecting lines are involved. For an electroluminescent display device, preferably, the use of the standard cathode-making process for simultaneously forming cathodes, connecting lines and crossovers is permitted.

This aim is achieved by providing an electrical device characterised in that the crossover is, at least at one side, bounded by an electrically insulating structure. The structure accurately delimits the crossover and electrically separates the crossover on one side of the structure from the area on the other side of the structure. It was found that the number of high-resolution display panels according to the invention that had an electrical short-circuit between two adjacent connecting lines, decreased dramatically. This result was obtained even when the standard cathode-making process for simultaneously forming cathodes, connecting lines and crossovers was applied.

The structures can be aligned very accurately and can be used to make crossover lines close to each other. For example, on each side of a structure, a crossover can be established, yielding a high density of crossovers and connecting-lines which is necessary for high resolution display panels. Moreover, the structure permits the use of the standard cathode-making process for simultaneously forming cathodes, connecting lines and crossovers.

The use of electrically insulating structures for the structuring of the cathode of an organic electroluminescent display panel is known from for example U.S. Pat. Nos. 5,294,869, 5,701,055, and 5,962,970. The ramparts divide the metal layer deposited so that the metal layer on the one side of the rampart is formed electrically separate from the metal layer on the other side of the rampart. None of the publications however discloses the use of electrically insulating structures to define an area of a crossover for connecting lines.

It is further preferred that the material between the conductive connecting line and the further conductive connecting line, at the position of the crossover, is an electrically insulating non-electroluminescent material, preferably an electrically insulating organic material, such as a resist. $SiO_x$ or $SiN_x$ deposited by PECVD may be used as well. It should be noted that, in contrast with the prior art, the electrically insulating structures in accordance with the invention may be formed on top of the electrically insulating non-electroluminescent material which electrically isolates the crossover to be formed from the underlying structures, such as further connecting lines or light emitting devices.

Preferably, the electrically insulating structures used for bounding a crossover according to the invention have an overhanging portion projecting in a direction parallel to the surface of the substrate. More preferably, the structures according to the invention have an inverse-tapered or T-shaped cross-section. By using such structures, bent or meandering connecting lines can be formed since electrical separation of the electrically conducting layer on top of the structures is obtained.

Preferably, each crossover is surrounded, preferably completely, by a separate electrically insulating structure, which reduces the risk of a short-circuit even further, because, in this case, there are two separate structures in-between two adjacent crossovers.

The electrical device may be an electroluminescent display device comprising several display pixels. A display pixel comprises a first electrode or set of electrodes and a second electrode or set of electrodes with an electroluminescent material layer sandwiched between these electrodes. The first or second electrodes may be connected to the first connecting line. The way of electrically connecting the first or second electrodes to their respective connecting points is particularly useful in organic electroluminescent display panels because the manufacturing methods used for making such organic electroluminescent display panels are particularly suited and sometimes already adopted for making the structures and for using the standard cathode-making process for forming cathodes, connecting lines and crossovers in one step.

Alternatively the electrical device relates to an integrated circuit employed on a glass substrate comprising connecting lines for the integrated circuit.

The invention further relates to a method for manufacturing an electrical device comprising a crossover of at least a first connecting line over at least a second connecting line, at least one of said connecting lines connecting to an electrical device, comprising the steps of:

Forming, either simultaneously or successively, said first connecting line and said second connecting line for said device on a substrate;

depositing an insulating layer on or over said first connecting line and said second connecting line, at least at the positions where said crossover is to be formed, defining or creating openings in said insulating layer at positions where electrical contacts are to be provided with said first connecting line and a connection point, forming electrically insulating structures which, at least partially, bound the area where said crossover is to be formed, depositing an electrically conductive layer to connect said first connecting line to said connecting point, which connecting point may be connected to another, second connecting line.

Preferably the electrically insulating structure surrounds the crossover. It is possible then to apply the electrically insulating structures before the insulating layer is deposited. The insulating layer may then be deposited only in the region where the crossover is to be formed.

Preferably the method for manufacturing a crossover is applied in connecting a display panel having a plurality of display pixels. Application of this method for a display panel are particularly useful in organic electroluminescent display panels, because the manufacturing methods used for making such organic electroluminescent display panels are particularly suited and sometimes already adopted for making the structures and for using the standard cathode-making process for simultaneously forming cathodes, connecting lines and crossovers.

The invention also relates to a test structure for testing a display panel comprising at least a first set of electrodes and a second set of electrodes, wherein said test structure is adapted to separately connect to said first set of electrodes and said second set of electrodes simultaneously from a single side of the display panel.

Testing of display panels before any connector and/or driver electronics has been applied is key to increase the overall yield of successfully manufactured display device and thus to decrease the manufacturing costs.

The invention moreover relates to a method for manufacturing test structures and a method for testing display devices.

Figure 2A:
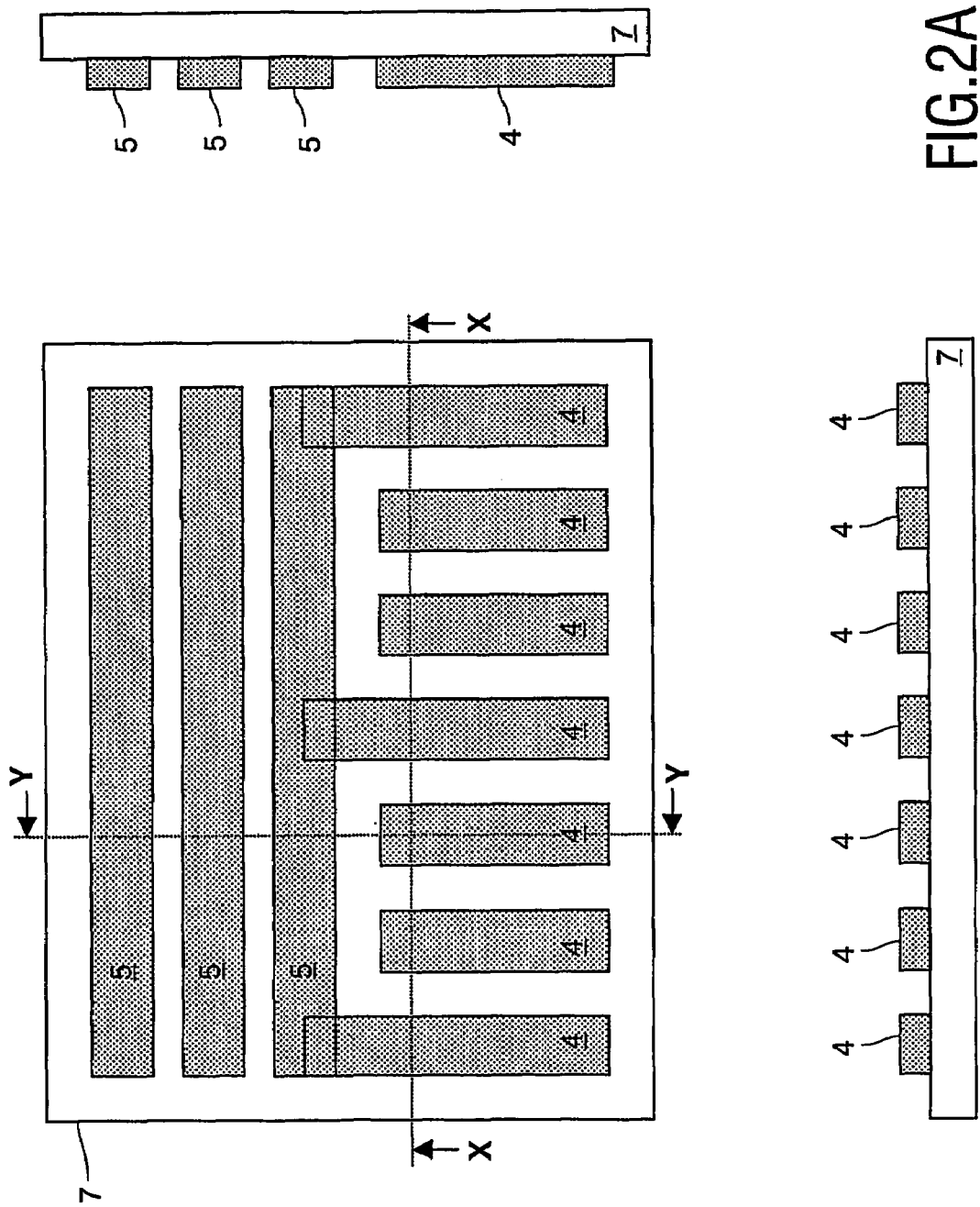
Figure 2B:
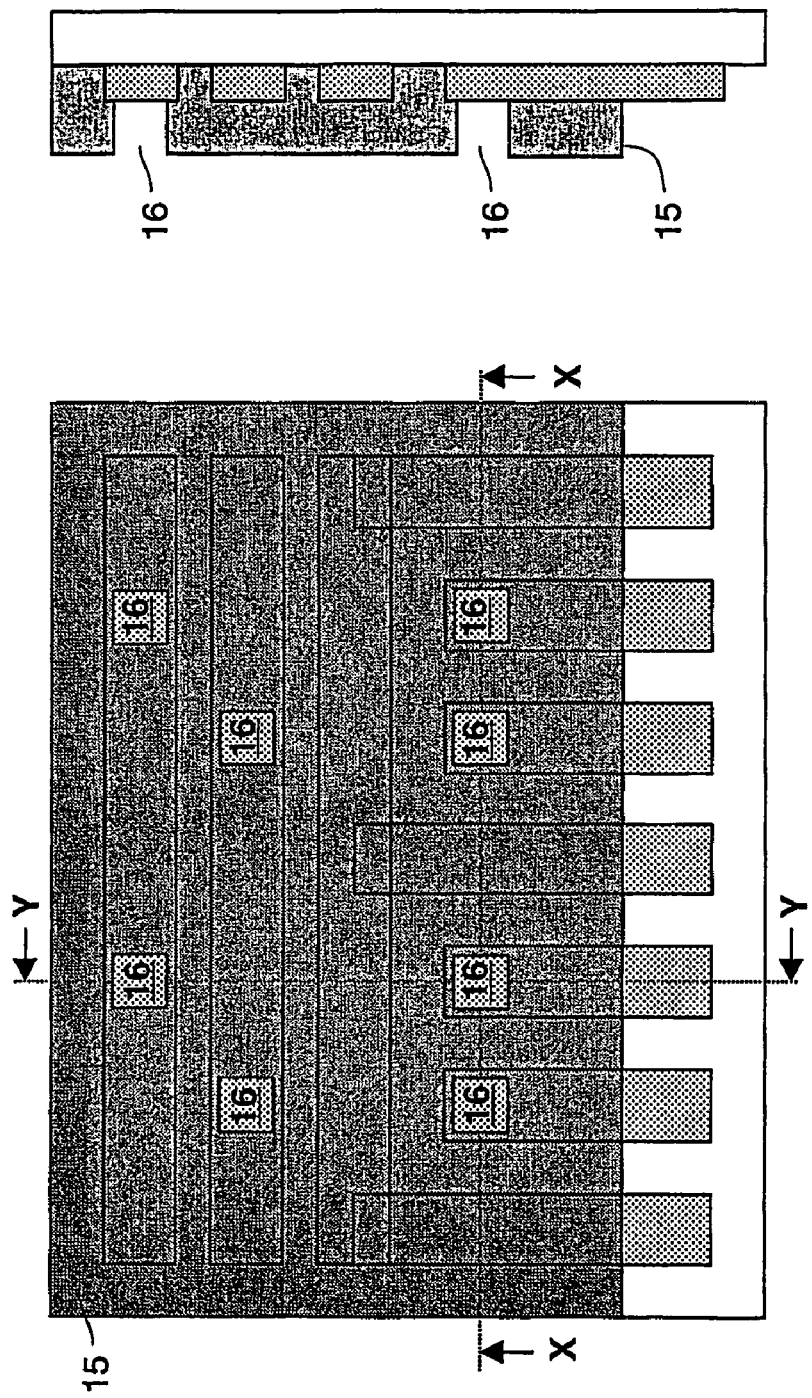
Figure 2C:
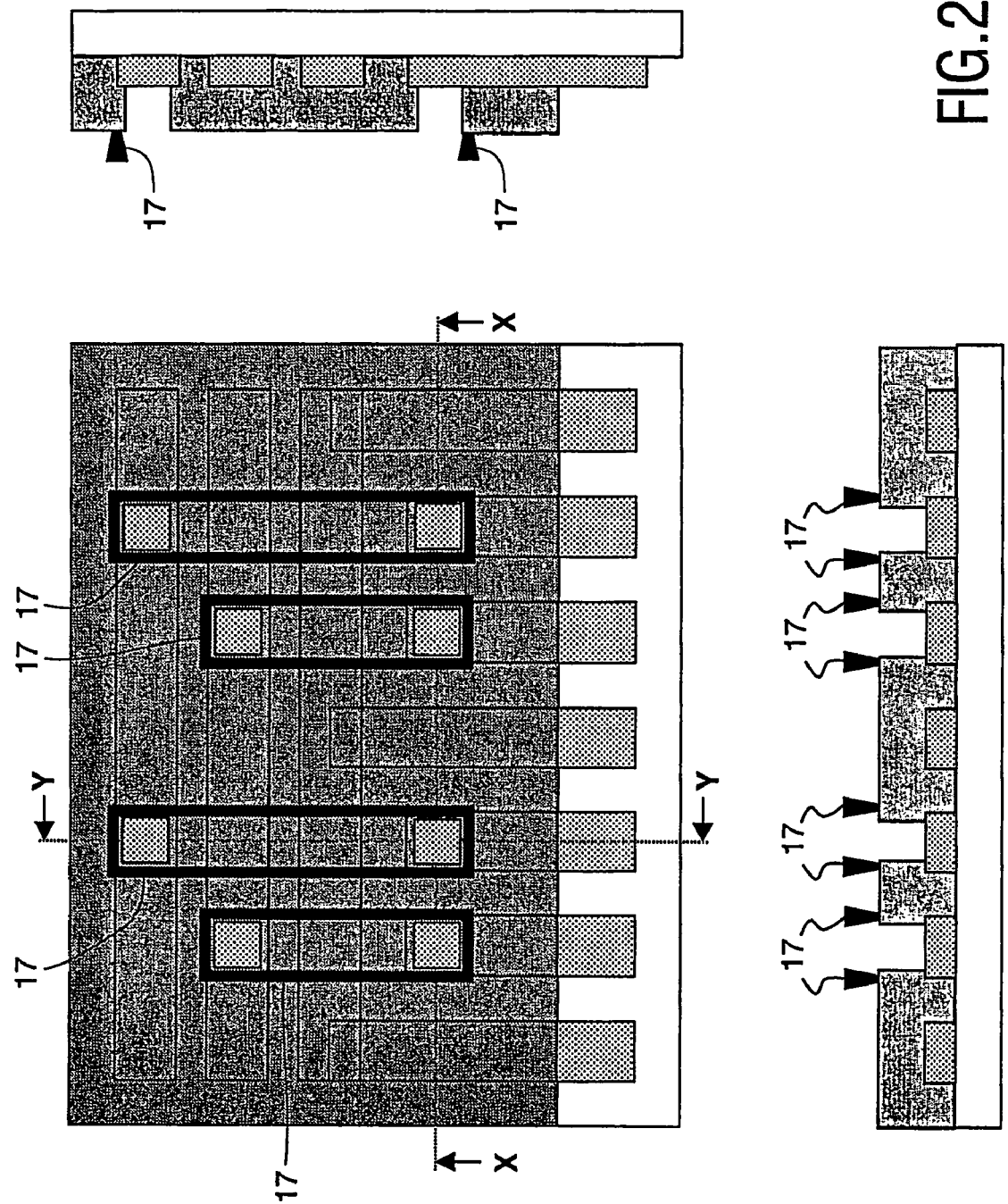
Figure 2D:
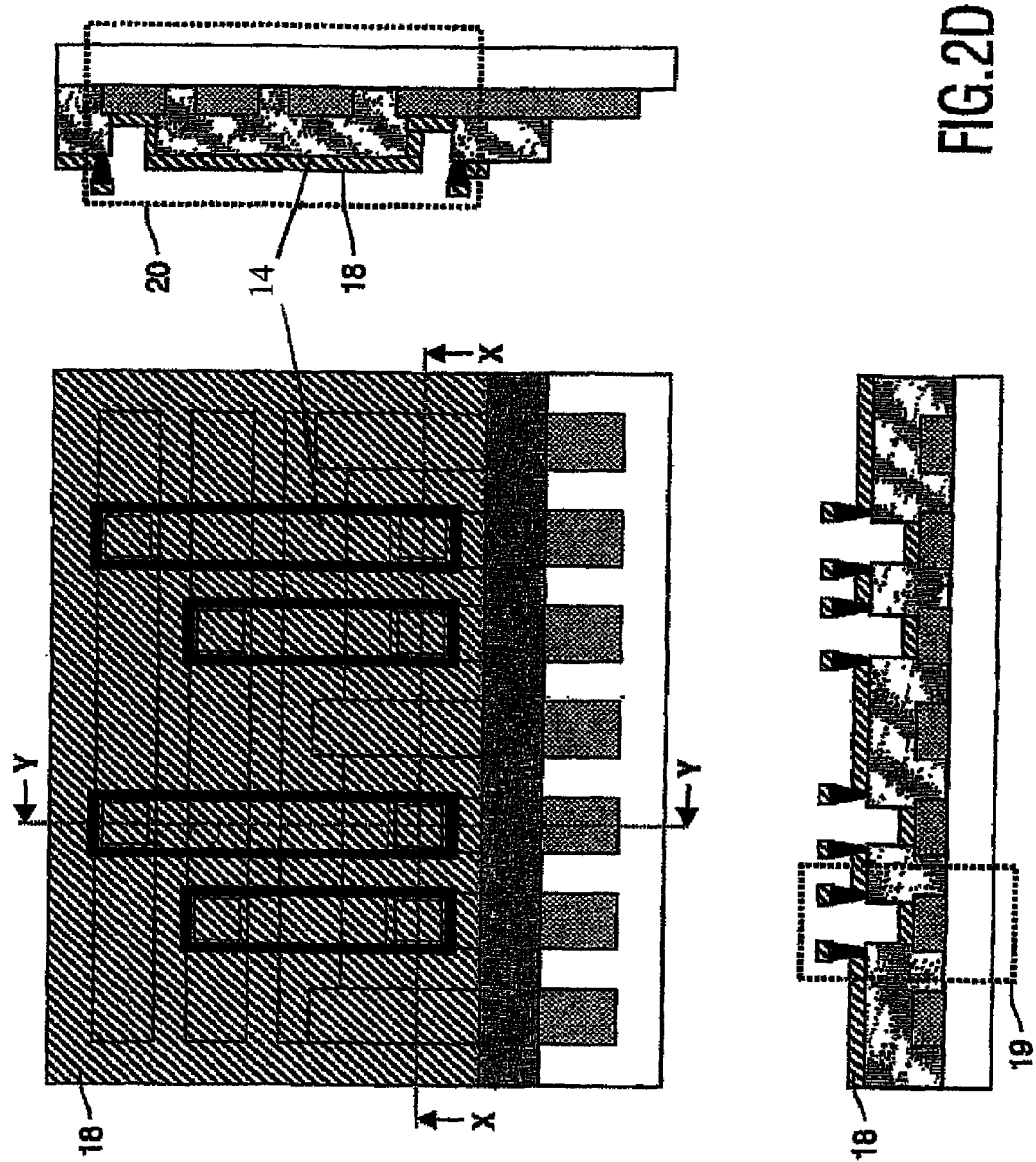
Figure 3A:
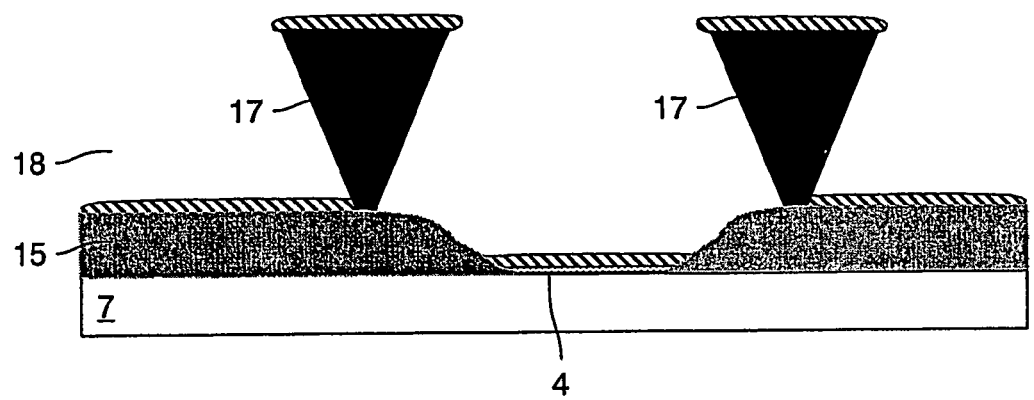

The embodiments of the invention will be described in more detail below with reference to the attached drawing (not to scale) in which FIGS. 1A, B schematically illustrate a display device, including the connections to the display panel and a display pixel;

FIGS. 2A-D illustrate the process of connecting to a display panel shown in FIG. 1A, according to an embodiment of the invention;

FIGS. 3A and B show an enhanced view of a section of FIG. 2D.

Figure 4:
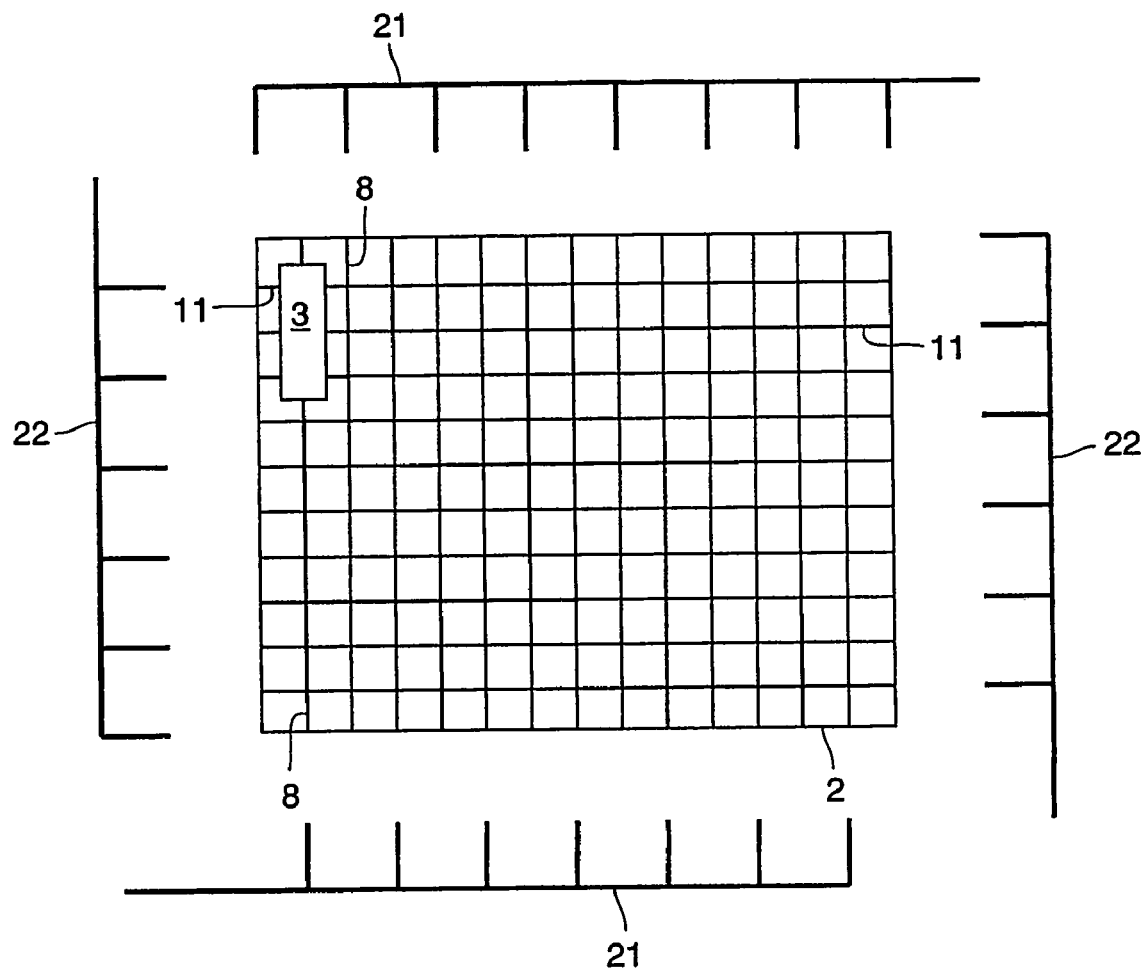

FIG. 4 schematically illustrates the use of conventional comb structures for testing a display panel.

FIGS. 5A-D show various embodiments of test structures according to an embodiment of the invention.

Next an embodiment of the invention wherein the electrical device is an electroluminescent display device will be discussed. It should be appreciated that the invention can also be applied for other electrical devices wherein components thereof are connected via connecting lines, such as integrated circuits, polymer electronics, solid state lasers, and for re-routing of signal lines or other lines on e.g. the electrical display device.

Figure 1B:
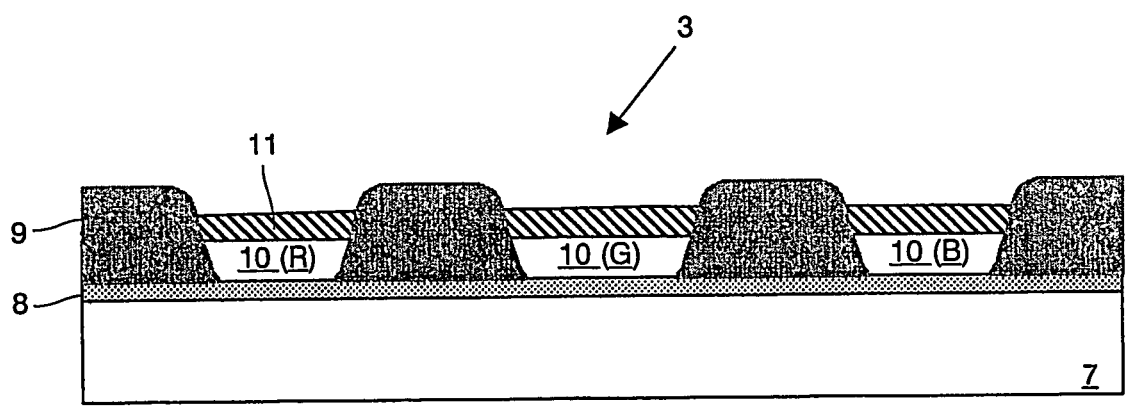

FIGS. 1A and 1B show an electroluminescent display device 1 comprising a display panel 2 exhibiting a plurality of display pixels 3 (LEDs) and a single display pixel 3, respectively. The display pixels 3 are arranged in a matrix of rows and columns and are mutually connected via first connecting lines 4 and second connecting lines 5. The display pixel 3 may be connected with further first connecting lines 6 as well.

FIG. 1B shows a schematic cross-section of a LED display pixel 3 having R, G and B sub-pixels. It should be appreciated that display pixels may be much more complex in reality; however the illustration in FIG. 1B is suited for the purpose of describing the embodiment according to the invention.

The display pixel 3 comprises a substrate 7. Preferably, the substrate 7 is transparent with respect to the light to be emitted by the display sub-pixels R, G and B. Suitable substrate materials include synthetic resin which may or may not be flexible, quartz, ceramics and glass. Alternatively a metal substrate with a dielectric layer on top can be applied for top emission displays. The total thickness of the substrate typically ranges from 50 µm to 10 mm, depending on the application. For large substrates, a larger substrate thickness is usually required.

A first electrode 8, commonly referred to as the anode, is deposited over or on top of the substrate 7. Preferably said first electrode 8 is transparent with respect to the light to be emitted. For example, a transparent hole-injecting electrode material, such as Indium-Tin-Oxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer has a thickness of 100 to 300 nm. If an ITO hole-injecting electrode is used, the first electrode is preferably the anode.

Next an insulating layer 9 is deposited on or over the first electrode 8. Insulating layer 9 is subsequently removed partially, at least at the positions where the display sub-pixels R, G and B are to be formed. It is noted that the invention is also applicable for monochrome displays. Next one or more layers 10, comprising luminescent materials, are deposited on or over the first electrode 8, at least at the positions where the sub-pixels R, G and B are to be formed. Although any technique may be used to provide the electroluminescent material, if an electroluminescent material having a high molecular weight is used, the layer 10 comprising the electroluminescent material is preferably deposited as a liquid using techniques known in the art, such as inkjet printing, spin-coating, dip-coating, Langmuir-Blodgett technique, spray-coating, and doctor-blade technique. Alternatively, if an electroluminescent material having a low molecular weight is used, the layer 10 comprising the electroluminescent material is preferably deposited via a gaseous medium using techniques known in the art, such as vacuum deposition and chemical vapour deposition (CVD).

The layer 10 comprising an electroluminescent material is covered with a second electrode 11, which layer is at least deposited at the positions where a display sub-pixel R, G or B was formed. Second electrode 11 is commonly referred to as the cathode. When a hole-injecting electrode material, such as Indium-Tin-Oxide (ITO), is used for the first electrode 8, the second electrode must be an electron-injecting electrode. Such an electron-injecting electrode is suitably made of a metal (alloy) having a low work function, such as Yb, Ca, Mg:Ag Li:Al, Ba or is a laminate of different layers such as Ba/Al or Ba/Ag. Such a second electrode is generally deposited by means of vacuum deposition.

The light emitting structure of display pixels 3 may be packaged by applying an encapsulation layer (not shown) over the entire structure or by means of a glass or metal lid.

The first connecting lines 4 and second connecting lines 5 are located outside the area of the display panel 2. Connecting lines 4, 5 enable signals to be applied to the displays pixels 3, to either the first electrodes 8 or the second electrodes 11. In FIG. 1A these signals may relate for a colour display device 1 to the colour signals red (R), green (G) and blue (B). Conveniently the complex of a red, green and blue display sub-pixel is referred to as a display pixel 3. It is noted that the display sub-pixels R, G and B may be arranged in several configurations to form the display pixel 3, such as a rectangular or a triangular configuration. The display pixels 3 may be mutually connected to further first connecting lines 6 as well. The invention as described below may also be applied for e.g. routing these lines over the display device 1, e.g. by routing the further connecting lines 6 so as to cross the second connecting lines 5 and/or the first connecting lines 4.

As discussed above, in present-day display devices a trend toward high resolution exists, which results in a substantial scale down of the electrode pitch, i.e. the distance between the anodes 8 and/or cathodes 11 within or between display pixels 3. As a consequence, at least the distances between the first connecting lines 4, connecting to these electrodes of the display pixels, decrease in accordance with this trend. Therefore the probability of electrical short-circuits between adjacent first connecting lines 4 increases, especially if the standard cathode-making process is used. In the standard cathode-making process, the cathodes 11, first connecting lines 4 and crossovers of the first connecting lines 4 over the second connecting lines 5 or further connecting lines 6 are made simultaneously Focussing now on the area 12 of the display device 1 in FIG. 1A, wherein the connecting lines 4 and 5 meet, it can be observed that some of the first connecting lines 4 are connected to a connecting point 13 that may be connected to one of the second connecting lines 5, providing a signal for the R sub-pixel, while others of the first connecting lines 4 have to cross the second connecting lines 5 by means of a crossover 14 in order to connect to another connecting point 13 at one of the second connecting lines 5, such as the ones providing signals for the G or B sub-pixels. It will be appreciated that said connecting points 13 do not necessarily connect to a second connecting line 5 supplying signals; they may alternatively be bonding pads or any other connecting points.

FIGS. 2A to 2D show a method according to the invention for the area 12 of FIG. 1A. Cross-sections X-X and Y-Y as indicated in the top view, showing only the intersected areas, are displayed as well.

In FIG. 2A the first connecting lines 4 and the second connecting lines 5 are deposited on the substrate 7 of the display device 1 in a thickness of e.g. 150 nm. Said first connecting line 4 is typically made from a material having a low electric resistivity, such as a metal or an alloy. Preferably, the connecting lines 4 and 5 are made from the same material as the first electrode 8. In this case, the first electrode 8 and the connecting lines 4 and 5 can be formed simultaneously on the substrate 7. For example, Indium-Tin-Oxide (ITO) may be used for both the connecting lines 4 and 5 and the first electrode 8. Alternatively, the connecting lines 4 and 5 are made from an ITO layer on top of the substrate, which ITO layer is covered by a layer of a material having a low electric resistivity, such as a metal or an alloy. The connecting lines 4 and 5 and the first electrode 8 may be formed by conventional deposition methods, such as vacuum deposition, and patterning methods, such as photolithography.

In FIG. 2B the deposition of an insulating layer 15 on or over the connecting lines 4, 5 and the substrate 7 is illustrated. The insulating layer 15, having a thickness of e.g. 2 µm for a photoresist, is at least applied where the crossovers 14 are to be formed, but may be applied in adjacent areas as well. The insulating layer 15 is preferably obtained from a conventional photoresist and planarises the substrate 7. It is noted that the insulating layer 15 and the insulating layer 9 in the display panel 2 may be the same layer deposited in a single process step. Openings 16, i.e. via's in the insulating layer 15 to the first connecting lines 4 and second connecting lines 5, are defined or created in the insulating layer 15, e.g. by photolithography or laser ablation.

In FIG. 2C electrically insulating structures 17 are applied on top of the insulating layer 15. The structure 17 accurately delimits, at least partially, the boundary where a crossover 14 is to be formed and thus, at least partially, the outline of the crossover 14. Although any patterning technique may be used to provide the structures, said structures are preferably obtained by photolithographically patterning a conventional photoresist. A suitable width is 1 to 50 µm, or, preferably 10 to 20 µm, a suitable height is 0.5 to 30 µm, a preferable height is 2 to 6 µm. The transverse profile of the structure 17 is suitably rectangular, although a structure 17 having an overhanging portion projecting in a direction parallel to the surface of the substrate is preferred.

Figure 3B:
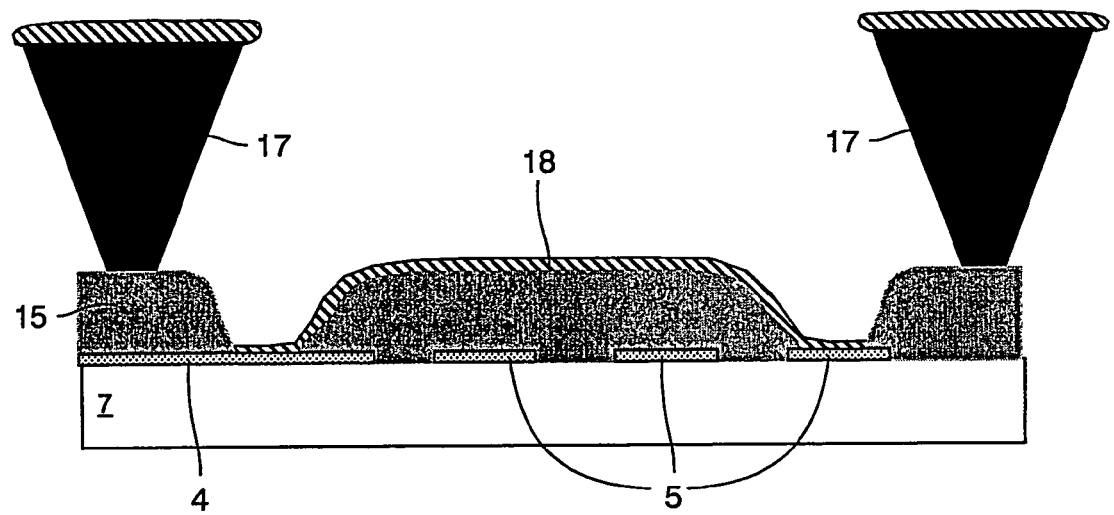

In addition, crossovers 14 can be formed by surrounding them with structures 17 having an overhanging portion projecting in a direction parallel to the surface of the substrate. This is more clearly illustrated in FIG. 3, which is discussed below.

Preferably, each crossover 14 is surrounded by a separate structure 17, as illustrated in FIGS. 2C and 2D. This reduces the risk of a short-circuit even further, because, in this case, there are two separate structures 17 in-between two adjacent crossovers 14. In this case, the structure 17 may be formed before the connecting lines 4 and 5 are covered by the insulating layer 15. Said covering can now carried out by done by depositing insulating material onto the area surrounded by the structure, for example by ink-jet printing. Subsequently, said insulating material is removed at the positions where openings 16 are to be formed, for example using laser ablation.

It is advantageous to deposit the layer 10 of the display pixel 3, comprising electroluminescent material, after the formation of the structures 17, because in this case the electroluminescent layers 10 are not exposed to the conditions prevailing in the structure-making process, which may be hostile to the electroluminescent materials.

In FIG. 2D an electrically conductive layer 18 is applied on or over the structure shown in FIG. 2C. The crossovers 14 are formed here since the electrically conductive layer 18 connects the first connecting lines 4 with the second connecting lines 5, as is most clearly illustrated in cross-section Y-Y indicated by means of arrows. The electrically conductive layer is typically made of a material having a low electric resistivity, such as a metal or an alloy and has a thickness preferably between 100-500 µm. If the electrically conductive layer 18 is deposited by means of vacuum deposition, which is generally the case, the structures 17 or a part thereof may conveniently serve as a shadow mask for the formation of the crossovers 14. When exposed to the material flux from which the crossovers 14 are deposited in vacuum, the structures 17 prevent the deposition of electrically conductive material at the locations which are in the shadow region provided by the direction of the material flux with respect to the structures 17, thus obtaining patterned crossovers 14 or a patterned electrically conductive layer 18.

Preferably, the electrically conductive layer 18 providing the crossovers 14, is of the same material as the second electrode or cathode 11 of the display pixel 3. In this case, the second electrode 11 and the electrically conductive layer 18 can be formed simultaneously in one vacuum deposition step.

It was previously noted with respect to FIGS. 2A-D that the drawings were not to scale. In FIGS. 3A and B a more realistic impression is given of the dimensions of the various layers and the shapes of the layers in the X-X cross-section, indicated by 19 in FIG. 2D and the Y-Y cross-section, indicated by 20 in FIG. 2D, respectively.

The display panel 2 including the connecting lines may be packaged by using an encapsulation layer (not shown) e.g. if the crossovers 14 are to be permanently applied in the electrical device 1. Alternatively a thin film package, comprising organic or inorganic components or combinations thereof, can be applied for protection. Such a thin-film package may substantially reduce diffusion of water into the structure. If the crossover structure is applied for testing, as will be discussed below, the crossovers 14 do not have to be packaged by the encapsulation layer but may be carefully handled until the test has been performed.

Various aspects of the method of manufacturing crossovers as described above can be used advantageously for testing an electrical device such as the display panel 2. Testing of display panels 2 before any connectors and/or driver electronics have been applied is key to increase the overall yield of successfully manufactured display devices and thus to decrease the manufacturing costs.

Conventionally two methods can be distinguished in which the appearance of these short-circuits can be tested. First, all the electrodes 8, 11 of the display panel 2 are contacted separately. This type of testing involves high expenses, since machine positioning with high accuracy of the electrode pitch is needed, and is therefore economically unattractive. Secondly, test comb structures 21, 22 can be applied, as shown in FIG. 4. In using these comb structures, each second anode 8 is connected on one side of the display panel 2 with a first comb structure 21 and the other remaining anodes 8 are connected to a second comb structure 21' at the other side of the display panel 2. The same procedure is applied for the cathodes 11.

Three types of short-circuits can be observed in display panels 2. Firstly, defects in the electroluminescent layer 10 may result in short-circuits between the first electrode or anode 8 and the second electrode or cathode 11 (AC-shorts). Secondly, adjacent anodes 8 in the display panel matrix 2 may connect each other, i.e. an A-A short exists. Thirdly, adjacent cathodes 11 may form a C-C short-circuit. By measuring the resistances using the comb structures 21, 22 the presence of short-circuits A-A, C-C and A-C can be detected. The comb-structures 21, 22 are removed after testing.

Using these test comb structures is a low-cost alternative, but using these comb structures for present-day display panels, being colour displays and split or tiled displays and displays with a very small electrode pitch, is difficult, if not impossible. For split displays only one side of the display is available for connection by a test comb structure. The R, G and B sub-pixels appeared to have different failure characteristics, i.e. short-circuit behaviour between the R, G and B sub-pixels is different. Therefore preferably each colour R, G and B is to be tested separately as a result of which three comb structures are needed. Unfortunately each side of the display panel 2 can only accommodate one comb structure.

In FIGS. 5A-D various embodiments of test structures are displayed wherein various aspects of the manufacturing of crossovers according to the invention have been applied. In general the method of defining crossovers according to the invention allows one single side of the display panel 2 to accommodate multiple comb structures 21, 22.

Figure 5A:
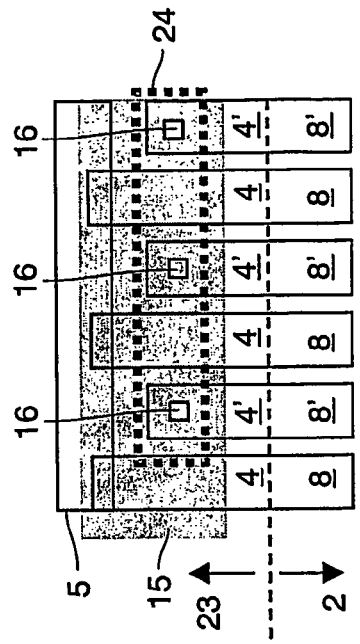

In FIGS. 5A and B two embodiments of comb structures for testing a monochrome split display panel 2 are displayed. In both embodiments, a test structure 23 comprises two comb structures, applied on one side of the display panel 2.

In FIG. 5A first connecting lines 4 and 4' and second connecting lines 5 and 5' are applied on the substrate. Next the insulating layer 15 is deposited on or over the connecting lines 4, 4', 5 and 5'. Openings 16 are created or defined either before or after deposition of the insulating layer 15 so as to enable connection of the first connecting lines 4' to the second connecting lines 5' afterwards. To establish this connection the electrically conductive layer 18 is deposited in the area indicated by 24. The test structure 23 enables the electrodes 8 and 8', each belonging to a different display panel 2 of the split display, to be approached and connected to simultaneously from one side of the display panel.

Figure 5B:
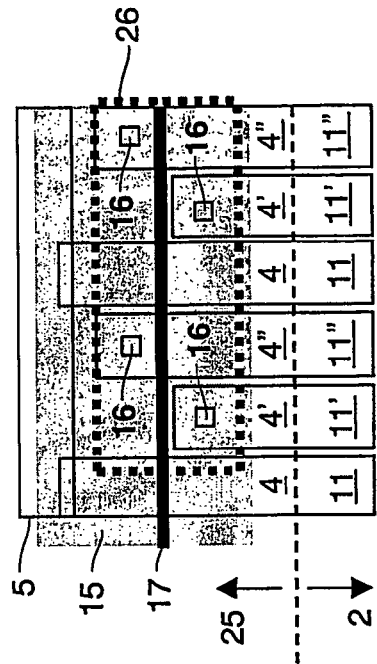

Alternatively, the second connecting lines 5 and 5' are applied at a different stage of the process and the insulating layer 15 is deposited accordingly, as shown in FIG. 5B.

Figure 5C:
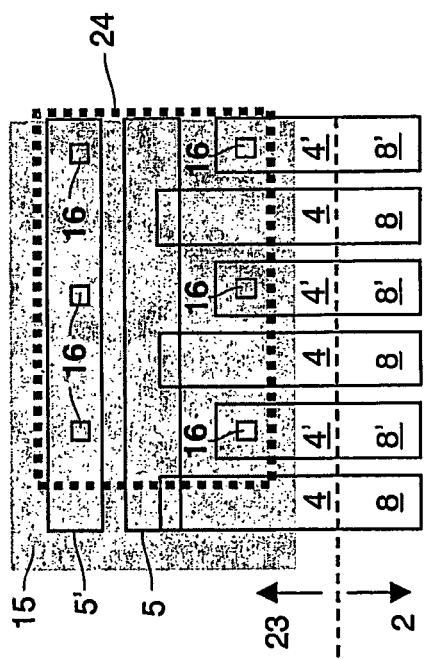
Figure 5D:
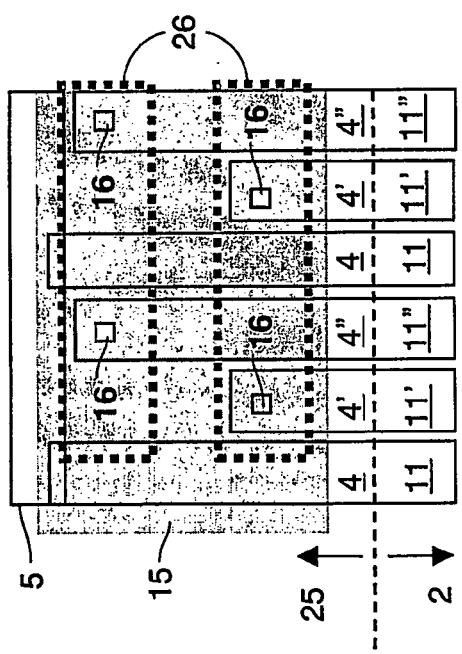

For colour display panels 2, a test structure 25 comprising three comb structures per panel side may be required, as explained above. In FIGS. 5C and 5D, two embodiments of such a test structure 25 are displayed.

The display panel 2 comprises three alternating sets of electrodes 11, 11' and 11". First connecting lines 4, 4' and 4" are applied for connecting to said sets of electrodes as well as a second connecting line 5. Next, the insulating layer 15 is deposited on or over the connecting lines 4, 4', 4" and 5 and openings 16 are created or defined in order to enable connection to the first connecting lines 4' and 4" afterwards. Finally the electrically conductive layer 18 is applied in the areas indicated by 26, which may be separated by applying a shadow mask.

In FIG. 5D a test structure 25 is shown wherein the electrically insulating structures 17 are used to separate the connections to be made to the first connecting lines 4' and 4", respectively, if the electrically conducting layer 18 is applied. Such a test structure 25 can be made very compact as the openings 16 can be created more closely to each other by using the structures 17, which is in contrast to the process using shadow masks as displayed in FIG. 5C. The structures 17 can be applied at various stages of the process described for the test structure of FIG. 5C. Preferably however the structures 17 are applied after deposition of the insulating layer 15.

In summary, the invention relates to the use of electrically insulating structures to define crossovers of connecting lines, which are to be bridged. At the crossover the connecting lines are covered with a insulating layer in which openings or contact holes are formed. The electrically insulating structures are preferably deposited on or over this insulating layer. Preferably an electrically insulating structure is used for each crossover to minimize the risk of a short-circuit between adjacent connecting lines. The electrically insulating structures can be aligned very accurately, and in using these structures, the standard cathode-making process can be applied to make small connecting lines close to each other. The invention allows new testing and routing methods, and efficient lead-outs for electrical devices. Such an electrical device may be an organic light emitting diode or a poly-LED.

For the purpose of teaching the invention, preferred embodiments of the electrical device, the method of manufacturing a crossover, the test structure and the method of testing have been described above. It will be apparent to the person skilled in the art that other alternative and equivalent embodiments of the invention can be conceived and reduced to practice without departing from the true spirit of the invention.

The invention claimed is:

1. A method for manufacturing an electrical device comprising a crossover of at least a first connecting line over at least a second connecting line, at least one of said connecting lines connecting to an electrical device, the method comprising:

forming said first connecting line and said second connecting line on a substrate;

depositing an insulating layer on said first connecting line and said second connecting line, at least in an area where said crossover is to be formed;

creating an opening in said insulating layer in a position where an electrical contact is to be provided between said first connecting line and a connection point;

forming an electrically insulating structure peripherally surrounding at least a portion of the area where said crossover is to be formed; and depositing an electrically conductive layer on the insulating layer to connect said first connecting line to said connecting point, which connecting point may be connected to another second connecting line.

2. The method of claim 1, wherein said electrically insulating structure is formed so as to extend in a direction substantially perpendicular to said substrate and to comprise at least one overhanging portion projecting in a direction substantially parallel to the surface of said substrate.

3. The method of claim 1, wherein said electrically insulating structure surrounds the crossover.

4. The method of claim 1, wherein said electrical device is an electroluminescent display device having at least one display pixel comprising a first electrode, an electroluminescent material and a second electrode, said method further comprising:

forming said first electrode simultaneously with said first connecting line and said second connecting line;

forming an electroluminescent layer on said first electrode, at least at a position where the at least one display pixel is to be formed; and forming said second electrode simultaneously with said electrically conductive layer, at least at the position where said display pixel is to be formed, so as to connect said first or second electrode with said first connecting line.

5. The method of claim 4, further comprising:

forming said electroluminescent layer after forming said electrically insulating structure.

6. The method of claim 1, wherein said electrical device is an integrated circuit and said first connecting line is connected to said integrated circuit.

7. The method of claim 6, wherein said integrated circuit is made on a glass substrate.

8. The method of claim 1, wherein the first and second connecting lines are formed simultaneously.

9. The method of claim 1, wherein the first and second connecting lines are formed successively.

* * * * *